(12) United States Patent
Suzuki et al.

(10) Patent No.: US 7,383,028 B2
(45) Date of Patent: Jun. 3, 2008

(54) TIMING ADJUSTMENT METHOD FOR WIRELESS COMMUNICATION APPARATUS

(75) Inventors: May Suzuki, Koganei (JP); Kazuyuki Hori, Tokyo (JP); Takashi Yano, Tokorozawa (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 512 days.

(21) Appl. No.: 11/033,905

(22) Filed: Jan. 13, 2005

(65) Prior Publication Data

US 2005/0153669 A1 Jul. 14, 2005

(30) Foreign Application Priority Data

Jan. 14, 2004 (JP) ............... 2004-006864

(51) Int. Cl.
*H01Q 11/12* (2006.01)
*H04B 1/04* (2006.01)

(52) U.S. Cl. ............... 455/126; 455/114.3; 455/115.1; 455/127.1; 455/108; 375/296; 375/297

(58) Field of Classification Search ............... 455/120, 455/124–126, 114.3, 115.1, 127.1, 108; 375/296, 375/297

See application file for complete search history.

(56) References Cited

U.S. PATENT DOCUMENTS

| | | | | |
|---|---|---|---|---|
| 5,524,286 A | * | 6/1996 | Chiesa et al. ............... | 455/126 |
| 5,699,383 A | * | 12/1997 | Ichiyoshi ............... | 375/297 |
| 6,275,685 B1 | * | 8/2001 | Wessel et al. ............... | 455/126 |
| 6,314,142 B1 | * | 11/2001 | Perthold et al. ............ | 375/296 |
| 6,597,747 B1 | * | 7/2003 | Azuma ............ | 375/298 |
| 6,771,708 B1 | * | 8/2004 | Suga et al. ............... | 375/278 |
| 6,836,517 B2 | * | 12/2004 | Nagatani et al. ............ | 375/296 |

(Continued)

FOREIGN PATENT DOCUMENTS

JP 2001-189685 7/2001

(Continued)

OTHER PUBLICATIONS

U.S. Appl. No. 10/655,045, filed Sep. 5, 2003, Suzuki et al.

(Continued)

*Primary Examiner*—Edward F. Urban
*Assistant Examiner*—RuiMeng Hu
(74) *Attorney, Agent, or Firm*—Antonelli, Terry, Stout & Kraus, LLP.

(57) ABSTRACT

The linearity of a transmission signal is improved in a wireless communication device by adjusting a delay difference between paths of two signals that are combined into one after modulation through the paths of different delay amounts, such as an r signal and a θ signal in EER. A transmitter includes: a DA converter unit which converts, into analog signals, separated input digital signals; a combiner which combines the analog signals obtained through the DA conversion with each other; a distributor which extracts a feedback signal; an AD converter which converts the feedback signal into a digital signal; an oscillator unit which supplies clock signals to the converters; a first separation unit which separates the feedback signal; and a comparator unit which compares the input signal and the feedback signal, wherein the oscillator unit controls the output clock signals based on a result of the comparison.

12 Claims, 9 Drawing Sheets

U.S. PATENT DOCUMENTS

| | | | |
|---|---|---|---|
| 7,010,280 B1* | 3/2006 | Wilson | 455/126 |
| 7,065,330 B2* | 6/2006 | Klingberg et al. | 455/126 |
| 7,068,980 B2* | 6/2006 | Seo et al. | 455/91 |
| 7,072,420 B2* | 7/2006 | Persson | 375/297 |
| 7,085,330 B1* | 8/2006 | Shirali | 375/296 |
| 7,212,791 B2* | 5/2007 | Arayashiki | 455/91 |
| 2002/0009979 A1* | 1/2002 | Kusunoki | 455/117 |
| 2003/0156658 A1* | 8/2003 | Dartois | 375/297 |
| 2003/0228856 A1* | 12/2003 | Orihashi et al. | 455/226.1 |
| 2003/0232607 A1* | 12/2003 | Le Bars et al. | 455/126 |
| 2004/0109512 A1* | 6/2004 | Fonden et al. | 375/297 |
| 2004/0203542 A1* | 10/2004 | Seo et al. | 455/126 |
| 2004/0208259 A1* | 10/2004 | Hunton | 375/296 |
| 2004/0248528 A1* | 12/2004 | Rozenblit et al. | 455/126 |
| 2005/0058220 A1* | 3/2005 | Nagatani et al. | 375/296 |
| 2005/0079835 A1* | 4/2005 | Takabayashi et al. | 455/127.1 |
| 2005/0238117 A1* | 10/2005 | Washakowski et al. | 375/302 |

FOREIGN PATENT DOCUMENTS

| | | |
|---|---|---|
| JP | 2002-084146 | 3/2002 |
| JP | 2002-368708 | 12/2002 |
| JP | 2003-174332 | 6/2003 |
| JP | 2003-243940 | 8/2003 |
| JP | 2003-273663 | 9/2003 |

OTHER PUBLICATIONS

Linear Interpolation Scheme for Compensation of Path-Delay Difference in an Envelope Elimination and Restoration Transmitter Proceedings of APMC2001, Taipei, Taiwan, R.O.C. pp. 1072-1075.

* cited by examiner

US 7,383,028 B2

TIMING ADJUSTMENT METHOD FOR WIRELESS COMMUNICATION APPARATUS

CLAIM OF PRIORITY

The present application claims priority from Japanese application JP2004-006864 filed on Jan. 14, 2004, the content of which is hereby incorporated by reference into this application.

BACKGROUND

This invention relates to a wireless transmitter/receiver having a function of adjusting, by way of closed-loop feedback control, the timing of a transmission signal. In particular, the invention relates to a wireless transmitter/receiver that employs EER to adjust the timing of sending an r (amplitude) component and a θ (phase) component.

For transmitters installed in base stations and terminals of cellular phone and other wireless communication systems, methods have been developed to separate a transmission signal into two components, process the two separately, and then recombine them as a transmission output. Known examples of such methods include one in which a transmission signal is separated into an I signal and a Q signal to be processed separately, and EER (Envelope Elimination and Restoration) in which a transmission signal is separated into an r (amplitude) component and a θ (phase) component to be processed separately.

However, signals created by separating one signal into two components to be processed separately differ from each other in signal propagation delay time in the case where processing circuits of the two components are arranged to present different signal path lengths. The separated signals could also differ from each other in signal processing time if different processing circuits are used to process the two. These result in disordered timing of recombining the separated signals into one signal and lowered quality of the recombined signal.

In EER, an r signal and a θ signal are combined, after receiving supply voltage modulation and frequency conversion, respectively, into one signal by a saturated power amplifier, which has high efficiency (see Je-Kuan Jau, "Linear Interpolation Scheme for Compensation of Path-Delay Difference in an Envelope Elimination and Restoration Transmitter", pp 1072-1075, Proceedings of APMC2001). The power consumption of a power amplifier which amplifies a transmission signal in a communication device constitutes a very large portion of the total power consumption of the communication device, and improving the power amplifier efficiency is a technical objective to be reached. EER addresses this objective by using a saturated power amplifier, which is high in efficiency, and is considered to be effective in reducing the size, cost and power consumption of a communication device.

A problem of EER is that it is liable to give r and θ signals different delay amounts from each other. While a supply voltage modulation circuit to process the r component is composed of, for example, a DC-DC converter, a frequency converter to process the θ signal is composed of a mixer or the like. Because of the vastly different circuit elements used by the two circuits, the delays caused in the process of signal processing mess up the timing of recombining the signals into one signal and greatly lower the quality of the recombined signal.

FIG. 7 is a waveform chart showing the principle of degradation in transmission signal quality due to delays of r and θ signals in EER.

When a sine wave is inputted to a transmitter that employs EER, the waveform of an amplitude component r (θ) 101 is that of a sine wave folded back along the x axis whereas a phase component p (θ) 102 forms a square wave. Normally, the folding back of the r (θ) 101 synchronizes with the phase inversion of the p (θ) 102. Here, consider the case where the phase inversion of the p (θ) 102 is behind the folding back of the r (θ) 101 by τ. A signal S (θ) 103, which is obtained by recombining these r (θ) 101 and p (θ) 102, experiences discontinuous phase inversions for the period τ, causing sharp peaks in an error signal u (θ) 104. This error signal component turns into spurious output (noise) and lowers the quality of the signal. In order to obtain a desired signal quality, the delay difference between the r signal and the θ signal somehow has to be adjusted to align the folding back and the phase inversion with each other.

FIG. 8 is a block diagram illustrating a conventional timing adjustment method for a wireless transmitter/receiver that employs EER. In FIG. 8, the amount of delay along a signal path for r (amplitude) 201 and the amount of delay along a signal path for θ (phase) 202 are made equal to each other by inserting a delay Δdd, which corresponds to the delay difference, Δdr minus Δdθ, to one of the paths where a delay caused by a circuit element is smaller (here, Δdr is larger than Δdθ and the delay Δdd is given to the θ side). It is a digital region where Δdd is inserted in FIG. 8 and, when Δdd is an integer multiple of the clock cycle, the adjustment can be made by simply delaying the θ signal by n clocks with the use of a shift register 203 or the like.

Usually, the delay scale is smaller than one clock and external factors such as a temperature variation make delay fluctuate with time. Je-Kuan Jau proposes a method of adjusting delay at a precision of ½ clock with the use of a digital filter, which performs a linear interpolation on a transmission signal. This structure uses, as FIG. 8 shows, a single master clock source 206 (fixed frequency) to drive digital-to-analog converters (DAC) 204 and 205 of the two paths.

Described next is an example of a timing adjustment method using a feedback (Fb) circuit for a wireless transmitter/receiver that employs other systems than EER.

FIG. 9 is a block diagram showing a timing adjustment method for a transmission signal and a feedback signal in a predistortion (distortion compensation) transmitter (see JP 2001-189685 A).

In FIG. 9, a feedback circuit 301 receives a signal that has been amplified by a power amplifier (PA) 302 and compares the amplified signal against the original transmission signal to measure the amount of nonlinear distortion caused along a transmission signal path (signal path for Tx) 303 including the power amplifier 302 and other elements. A pre-distortor co-efficient calculation unit 304 calculates a coefficient that gives a distortion of the reverse characteristic to cancel the non-linear distortion, and sets the obtained coefficient to a pre-distortor 305. The pre-distortor 305 applies a non-linear distortion determined by the set coefficient to the transmission signal, which is then sent to a frequency-conversion and amplifier unit 307 through a DAC 306.

Meanwhile, in order to align the transmission signal and the feedback signal with each other for comparison, a delay time calculation unit 308 detects the delay difference between the two and determines the amount of delay of a shift register 309 (Δd1) and the amount of delay of a variable delay element 310 (Δd2). The delay amount Δd1 of the shift register 309 corresponds to a delay for the transmission signal by an integer multiple of the clock cycle. The delay amount Δd2 of the variable delay element 310 corresponds to a delay on the 1/n clock-basis of the clock phase of an analog/digital converter (ADC) 311, which converts the feedback signal into a digital signal. In this structure, the same single master clock source is used to drive the DAC 306 and the ADC 311, and the clock phase of the master clock source is fixed.

SUMMARY

While being capable of adjusting a delay smaller than one clock, the method shown in FIG. 8 has a problem of signal quality degradation since quantization error remains in the adjustment amount, due to its inconsecutiveness, and the group delay characteristics of the filter make the amount of delay vary from frequency to frequency. Although Δdd could be inserted in an analog region with the use of a delay line, the resultant performance is poor because causing a delay of accurate amount is difficult and the analog element is greatly fluctuated in characteristic by external factors such as a temperature variation. In addition, discontinuously changing the delay amount to be inserted causes, at an instant, a discontinuous change in waveform of the transmission signal and it can worsen the spurious output characteristics of the transmission signal.

The method shown in FIG. 9 suffers from quantization error remaining in the adjustment amount as does the method of FIG. 8. Furthermore, the method of FIG. 9 is for timing the transmission signal and the feedback signal with each other, not for adjusting a delay difference between the two components of the transmission signal, and therefore is not capable of solving the problem of EER.

This invention has been made in view of the above problems and it is therefore an object of this invention to provide a method of adjusting, through a simple circuit, with high precision, a delay difference between an r signal and a θ signal in a transmitter/receiver that employs EER. It is another object of this invention to provide a method of adjusting a delay difference between paths of two signals such as an I signal and a Q signal which are originally one signal and recombined after traveling along the paths of different delay amounts for modulation in a transmitter/receiver that employs other systems than EER.

According to the present invention, there is provided a transmitter comprising: a DA converter unit which converts, into analog signals, two digital signals that are obtained by separating an inputted digital signal or two digital signals that are separately inputted; a combiner which combines the analog signals obtained through the conversion by the DA converter unit with each other; a distributor which extracts a portion of the combined signal as a feedback signal; an AD converter which converts the feedback signal into a digital signal; an oscillator unit which supplies clock signals to operate the DA converter unit and to the AD converter; a first separation unit which separates the feedback signal converted by the AD converter into two signals; and a comparator unit which compares the separated input signal and the feedback signal separated by the first separation unit, wherein the oscillator unit controls the output clock signals based on a result of the comparison by the comparator unit.

Unlike the conventional methods which directly measure a delay difference between an r signal and a θ signal, this invention judges the timing of the transmission signal and the timing of the feedback signal in relation to each other (one is behind or ahead of the other), and therefore a measure to compare the two can have a simple structure.

Furthermore, this invention uses a VCO (Voltage Controlled Oscillator) as a clock signal generating unit, thereby making it possible to follow changes in delay amount in a continuous manner and give the transmission signal improved spurious output characteristics compared to the conventional methods.

As a result, an output signal of a transmitter/receiver that employs EER is improved in quality and the efficiency of its power amplifier is enhanced. The output signal quality is also improved in a transmitter/receiver that employs other systems than EER while keeping the area and power consumption of a control circuit small.

DETAILED DESCRIPTION OF THE PREFERRED EMBODIMENTS

Figure 1:
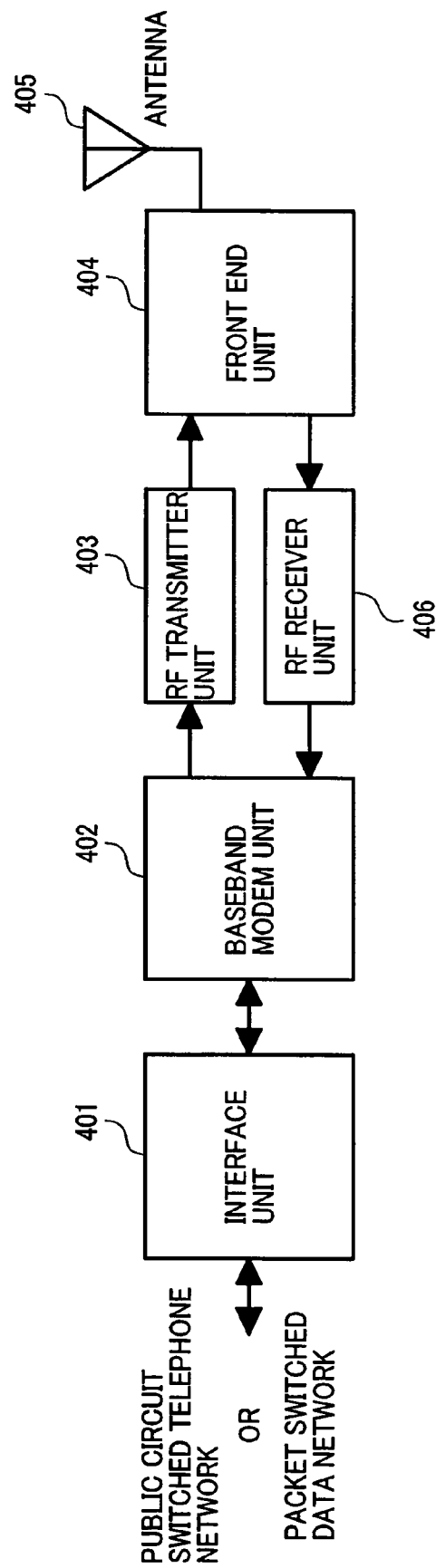
FIG. 1 is a block diagram showing a common structure of a transmitter/receiver used for a wireless communication system.

FIG. 1 is a block diagram showing a common structure of a transmitter/receiver for a wireless base station.

The transmitter/receiver is composed of an interface unit 401, which is connected to a public switched telephone network or a packet switching data network, a baseband unit 402, which performs digital modulation/demodulation processing, an RF transmitter unit 403; which performs, on a transmission signal, digital-to-analog conversion to convert the transmission signal into an analog signal as well as frequency conversion for conversion from the baseband bandwidth to the RF bandwidth, and which amplifies the output power, a frontend unit 404, which is composed of a filter, a duplexer and others, an antenna 405, and an RF receiver unit 406, which converts the frequency of the transmission signal from the RF bandwidth to the baseband bandwidth and which performs analog-to-digital conversion on the transmission signal after out-of-band noise is removed with the use of a filter. This invention particularly relates to the structure of the RF transmitter unit 403.

Figure 2:
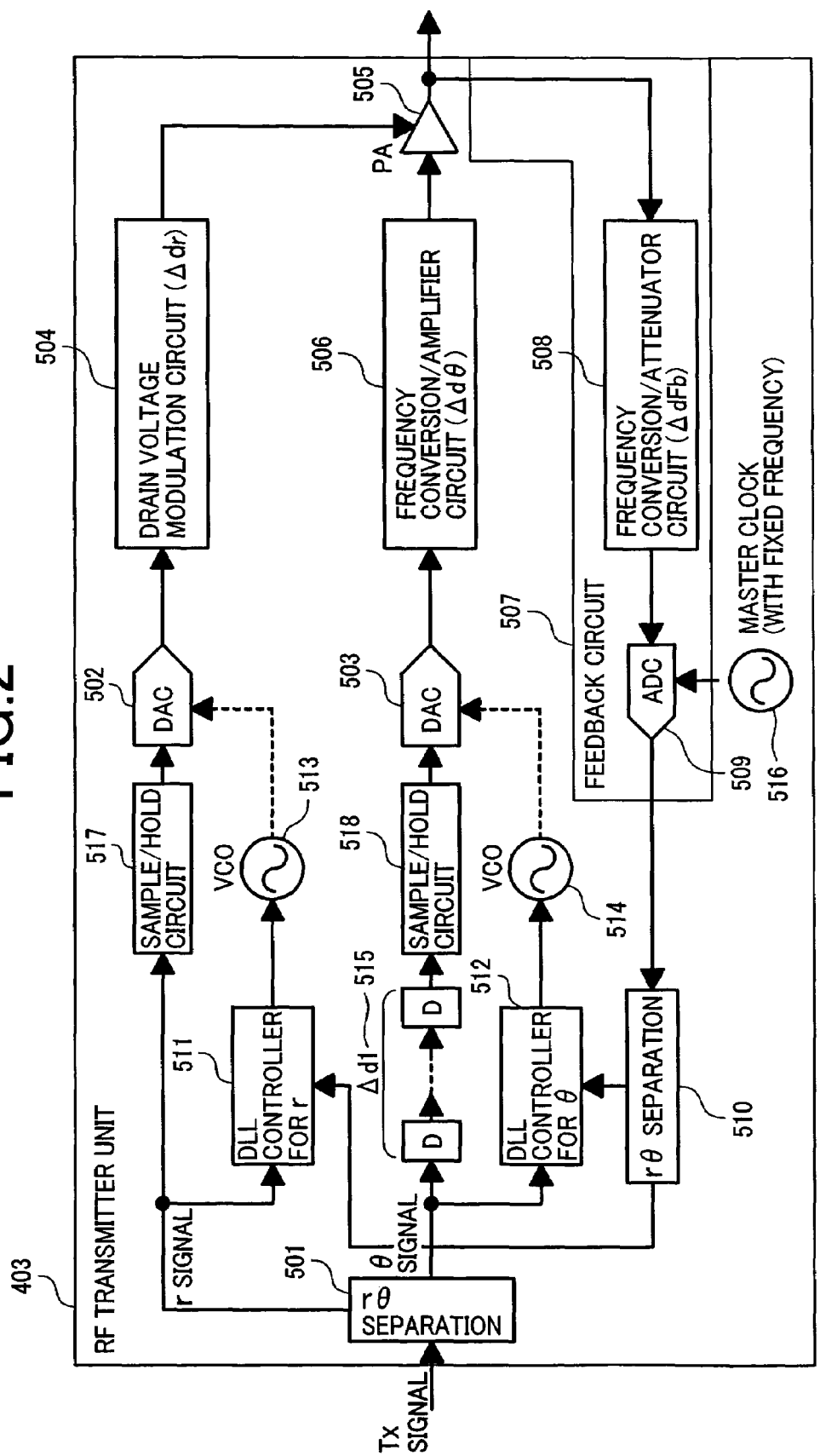
FIG. 2 is a block diagram showing the structure of an RF transmitter unit according to a first embodiment of this invention.

FIG. 2 is a block diagram showing the structure of the RF transmitter unit 403 according to a first embodiment of this invention.

A transmission signal inputted from the baseband unit 402 is separated into an r (amplitude) component and a θ (phase) component by an rθ separation unit 501. The r component and the θ component are converted into analog signals in digital-to-analog converters (DAC) 502 and 503, respectively. The r signal is converted by a drain voltage modulation unit 504 into a signal to control the supply voltage (drain voltage) of a power amplifier (PA) 505. The converted signal is inputted to a supply terminal of the power amplifier 505, with the result that the envelope curve of an output signal of the power amplifier 505 resembles the waveform of the r signal. The θ signal receives, in a frequency-conversion and amplifier unit 506, frequency conversion to be converted to the RF bandwidth (up conversion) and power amplification. The amplified θ signal is inputted into a signal input terminal of the power amplifier 505.

A portion of an output of the power amplifier 505 is distributed to a feedback circuit 507 by a distributor (coupler, or the like, omitted from the drawing). In the feedback circuit 507, a frequency-conversion and attenuator unit 508 attenuates the power of the distributed output, which then receives frequency conversion to be converted to the baseband bandwidth (down conversion) and is converted into a digital signal by an analog-to-digital converter (ADC) 509. Thereafter, this feedback signal is separated into an r (amplitude) component and a θ (phase) component by an rθ separation unit 510. The r component of the feedback signal is compared by an r signal DLL (Delay Locked Loop) 511 against the r component of the transmission signal whereas the θ component of the feedback signal is compared by a θ signal DLL 512 against the θ component of the transmission signal.

With the circuit structure to be described below, the DLL 511 and 512 judge which one of a phase of a transmission signal and a phase of a feedback signal is ahead of (or behind) the other. Based on the judgment, the DLL circuits control the output phase of a voltage controlled oscillator (VCO) 513, which supplies clock signals to the r signal DAC 502, and the output phase of a VCO 514, which supplies clock signals to the θ signal DAC 503, in a manner that makes the difference converges to zero (in a manner that makes the timing of the transmission signal and the timing of the feedback signal synchronize with each other). The feedback signal ADC 509 receives clocks from the oscillator (master clock source) 516 of which output frequency is fixed.

In the case where a delay difference between the path of the r signal and the path of the θ signal is one clock or more, the integer portion of the difference (in the example of FIG. 2 where Δdr is larger than Δdθ, the integer portion corresponds to the quotient of Δdr minus Δdθ divided by the clock cycle) is adjusted by a shift register 515 whereas the remainder of the division is adjusted by controlling the VCOs 513 and 514. Therefore, it is not necessary to widen the phase (frequency) control range of the VCOs 513 and 514 and the output signal characteristics (for example, C/N) of the VCOs can be improved.

The DACs 502 and 503 operate on clock signals created by the VCOs 513 and 514, independent of the timing at which their input signals change. The DACs 502 and 503 may accordingly take in input signals at the very moment the input signals undergo changes. In this case, bits of the input signals do not necessarily change simultaneously and wrong data could be inputted to the VOCs depending on input timing. As preventative measures, sample-and-hold (S/H) circuits 517 and 518 are provided on the input side of the DAC 502 along the r signal path and on the input side of the DAC 503 along the θ signal path, respectively. The sample-and-hold circuits 517 and 518 hold data to avoid skipping data that is to be inputted to the DACs 502 and 503 despite a change in timing of inputting clocks in the DACs 502 and 503.

Figure 3:
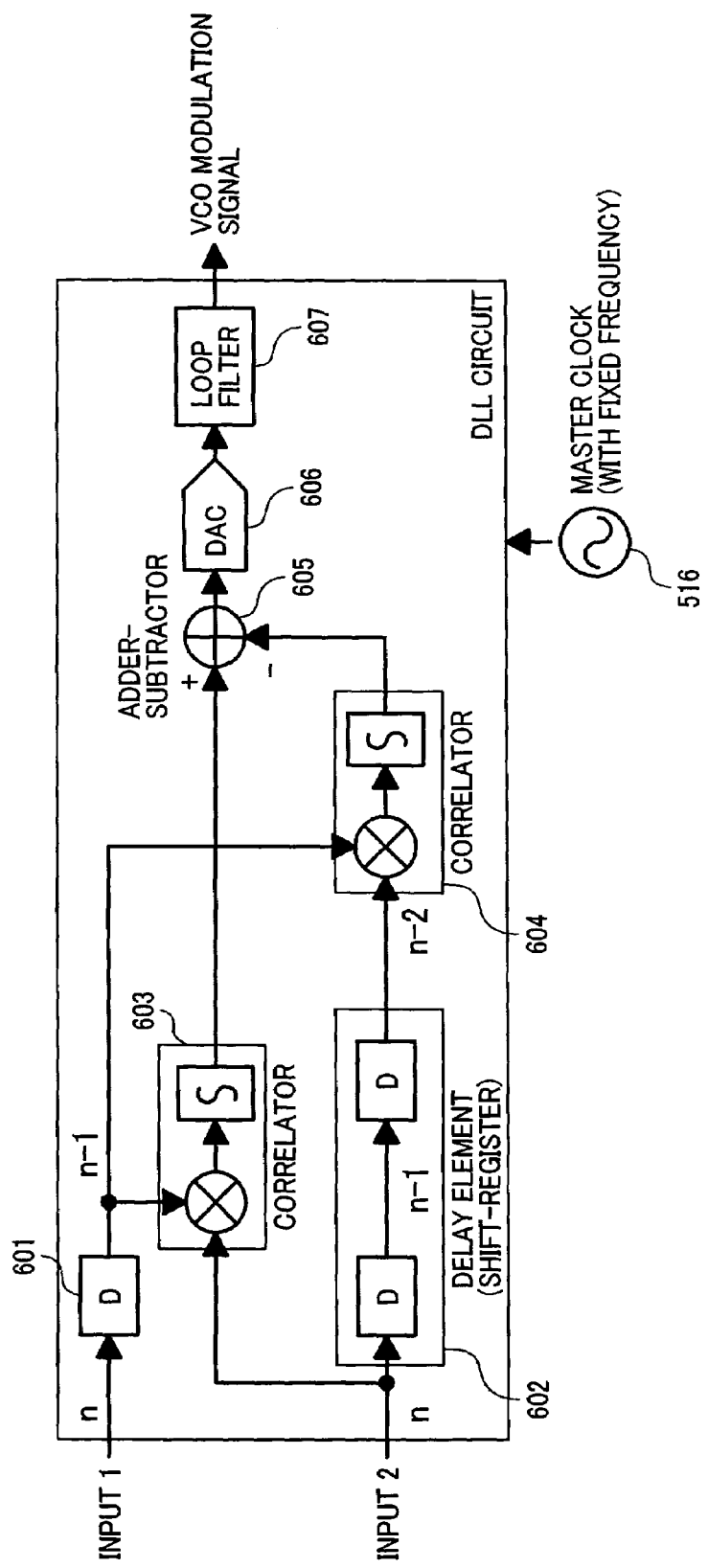
FIG. 3 is a block diagram showing the structure of a DLL used in this invention.

FIG. 3 is a block diagram showing the structure of the DLL 511 and 512 used in this invention. This circuit structure is disclosed in, for example, JP 2003-273663 A.

In the DLL 511, an input 1 corresponds to the r component of the transmission signal, an input 2 corresponds to the r component of the feedback signal, and a VCO control signal output is connected to the VCO 513. In the DLL 512, an input 1 corresponds to the θ component of the transmission signal, an input 2 corresponds to the θ component of the feedback signal, and a VCO control signal output is connected to the VCO 514.

Each DLL circuit uses shift registers 601 and 602, which operate in sync with a master clock source 516, to delay input signals. A correlator 603 multiplies the value of the power of an (n−1)-th sample point (701 in FIG. 4) of the input 1 by the value of the power of an n-th sample point (702 in FIG. 4) of the input 2, and integrates the multiplication result over a given interval. A correlator 604 multiplies the value of the power of the (n−1)-th sample point (701 in FIG. 4) of the input 1 by the value of the power of an (n−2)-th sample point (703 in FIG. 4) of the input 2, and integrates the multiplication result over a given interval. Thereafter, the difference between the two integration results is calculated by an adder and subtractor 605, converted by a DAC 606 into an analog signal, and then inputted to the VCO 513 or 514 through a loop filter 607.

Figure 4:
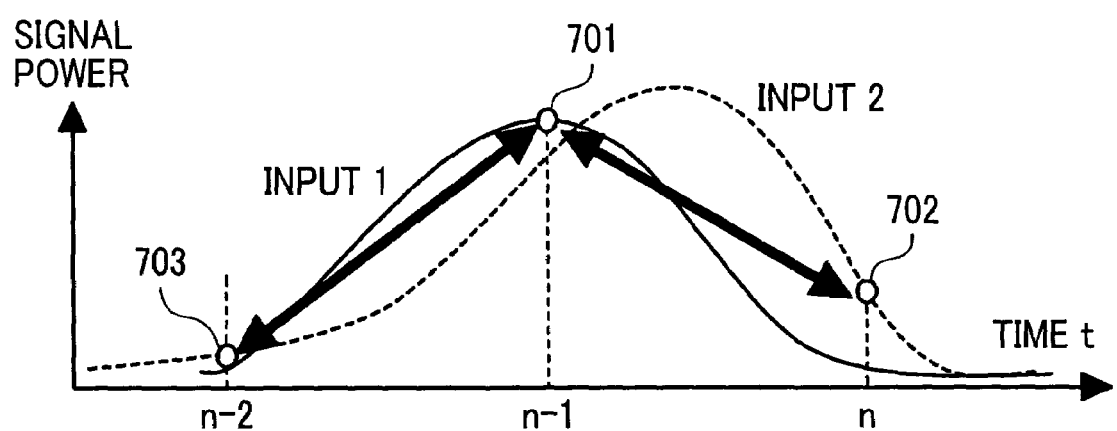
FIG. 4 is a waveform diagram showing an example of signal power changes with time of the input of the DLL circuits.

FIG. 4 is a waveform diagram showing an example of signal power changes with time of the input 1 and of the input 2.

After calculating the difference between the two integration results, the adder and subtractor 605 outputs a positive value since the result of the calculation by the correlator 603 is larger than the result of the calculation by the correlator 604 with the value of the sample point 701 being common to both and the value of the sample point 702 being larger than the value of the sample point 703. This means that the transmission timing of the input 1 is behind the transmission timing of the input 2 as shown in FIG. 4. To remedy the situation, the output frequency of the VCOs 513 and 514 is set higher by raising the output voltage of the DLL 511 and 512 (the voltage of VCO control signals). This advances the timing at which the DACs 502 and 503 take in the input 1 (the r signal and θ signal of the transmission signal) toward the timing at which the input 2 (the r signal and θ signal of the feedback signal) is inputted.

According to the first embodiment, the timing of transmitting the r signal and the timing of transmitting the θ signal are controlled with output phases of two VCOs independently of each other. Therefore, chances are small that the former and the latter affect each other's stability. On the other hand, the former and the latter are successfully aligned with each other since the timing of the same feedback signal is used as the control guide.

Furthermore, the first embodiment is capable of making the amount of delay of the r signal and the amount of delay of the θ signal equal to each other despite a temperature variation and a change with time, which the conventional method of presetting a delay amount cannot overcome.

Figure 5:
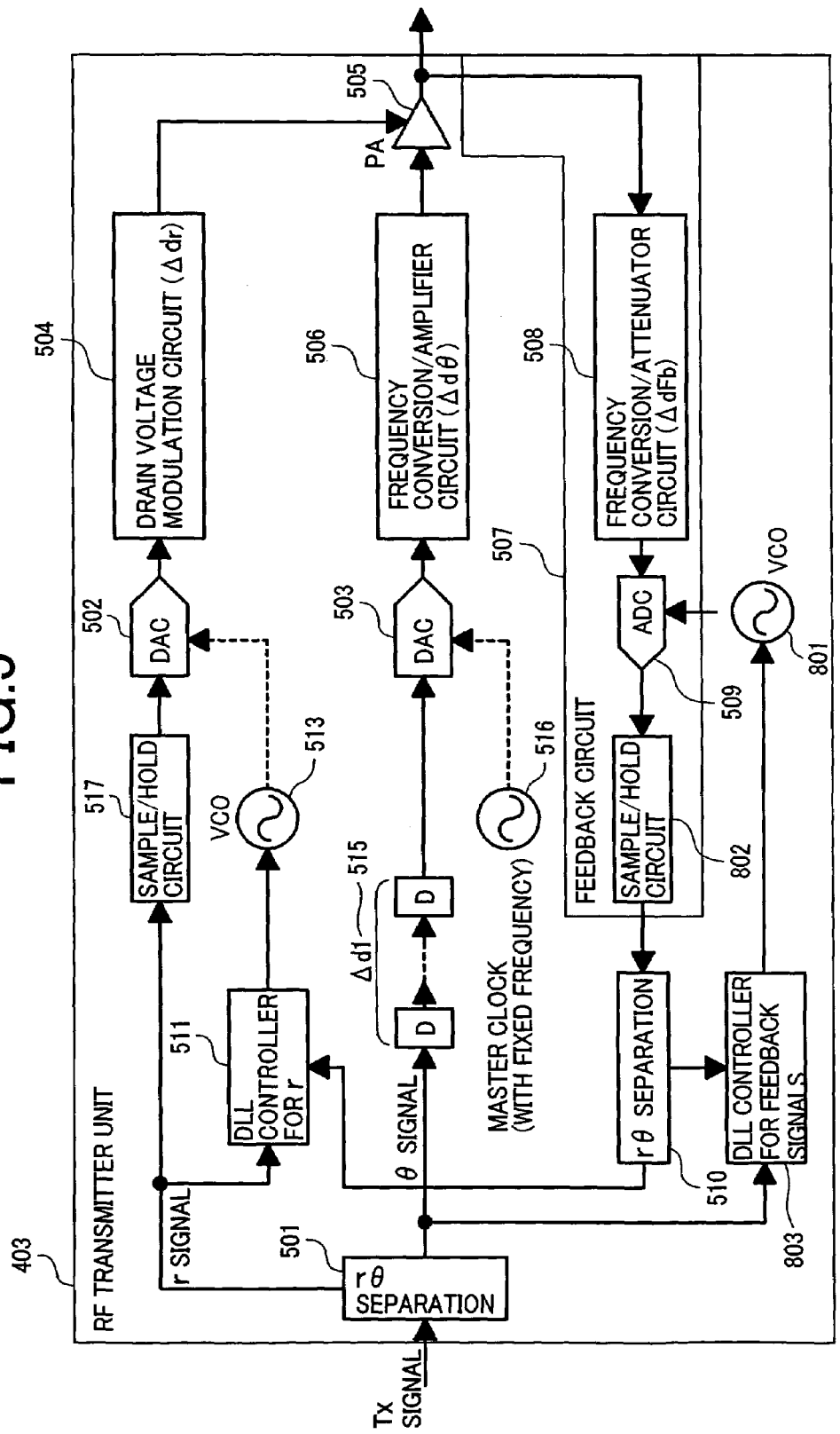
FIG. 5 is a block diagram showing the structure of an RF transmitter unit according to a second embodiment of this invention.

FIG. 5 is a block diagram showing the structure of an RF transmitter unit 403 according to a second embodiment of this invention.

In this embodiment, the timing of a feedback signal is adjusted with the timing of transmitting a θ signal as reference and the timing of transmitting an r signal is adjusted based on the thus adjusted timing of the feedback signal. This embodiment shares its basic structure with the first embodiment (FIG. 2) except a timing adjustment circuit of the RF transmitter unit 403. A detailed description on the structure common to this embodiment and the first embodiment will be omitted here.

In this embodiment, the master clock source 516 supplies clock signals to the θ signal DAC 503 whereas the VCO 513 and a VCO 801 supply clock signals to the r signal DAC 502 and the feedback signal ADC 509, respectively. The feedback signal is sampled and digitized by the ADC 509. Then the value of the feedback signal is held by a sample-and-hold circuit 802 to prevent the rθ separation unit 510, which operates on master clocks, from taking in a wrong value.

Thereafter, the feedback signal is separated into an r (amplitude) component and a θ (phase) component by the rθ separation unit 510. The r component of the feedback signal is compared by the r signal DLL 511 against the r component of the transmission signal whereas the θ component of the feedback signal is compared by a feedback signal DLL 803 against the θ component of the transmission signal.

With the circuit structure described above, the DLL 511 and 803 judge which one of a phase of a transmission signal and a phase of a feedback signal is ahead of (or behind) the other. Based on the judgment, the DLL circuits control the output phase of a VCO 513, which supplies clock signals to the r signal DAC 502, and the output phase of a VCO 801, which supplies clock signals to the feedback signal ADC 509, in a manner that makes the difference converges to zero (in a manner that makes the timing of the transmission signal and the timing of the feedback signal synchronize with each other). The θ signal DAC 503 receives clocks from the master clock source 516 of which output frequency is fixed.

As in the first embodiment, in the case where a delay difference between the path of the r signal and the path of the θ signal is one clock or more, the integer portion of the difference (in the example of FIG. 5 where Δdr is larger than Δdθ, the integer portion corresponds to the quotient of Δdr minus Δdθ divided by the clock cycle) is adjusted by the shift register 515 whereas the remainder of the division is adjusted by controlling the VCOs 513 and 801. Therefore, it is not necessary to widen the phase (frequency) control range of the VCOs 513 and 801 and the output signal characteristics (for example, C/N) of the VCOs can be improved.

The structure of the DLL 511 and 803 is the same as that of the DLL circuits in the first embodiment which is shown in FIG. 3. Here, in the DLL 511, an input 1 corresponds to the r component of the transmission signal, an input 2 corresponds to the r component of the feedback signal, and a VCO control signal output is connected to the VCO 513. In the DLL 803, an input 1 corresponds to the θ component of the transmission signal, an input 2 corresponds to the θ component of the feedback signal, and a VCO control signal output is connected to the VCO 801.

This embodiment is structured such that the master clock source 516 supplies clocks to the θ signal DAC 503 whereas the VCO 513 supplies clocks to the r signal DAC 502. Instead, the r signal DAC 502 may receive clocks from the master clock source 516 whereas the θ signal DAC 503 receives clocks from the VCO 513. However, the structure shown in FIG. 5 provides higher stability than this modification example since the fluctuation amount of the θ component is generally smaller than the fluctuation amount of the r component. In the modification example, the θ signal separated from the transmission signal and the θ signal separated from the feedback signal are inputted to the DLL 511 whereas the r signal separated from the transmission signal and the r signal separated from the feedback signal are inputted to the DLL 803.

According to this embodiment, the demodulation precision of a feedback signal is improved by adjusting the timing of the feedback signal with the θ component, which has less fluctuation amount, as the reference. In addition, the stability is high since master clocks are supplied to one of the two (r and θ) components of a transmission signal (preferably the θ signal whose fluctuation amount is small).

Figure 6:
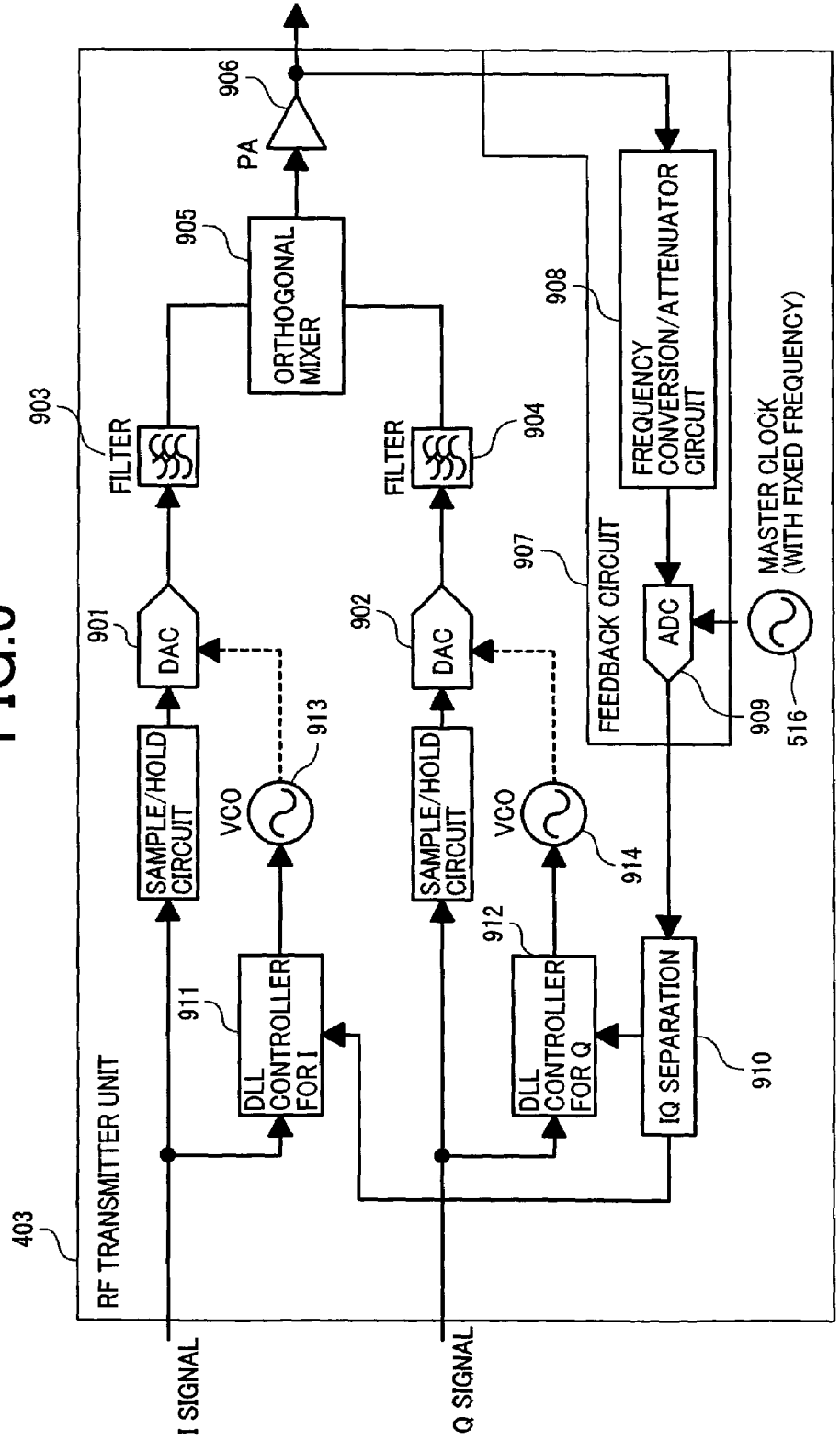
FIG. 6 is a block diagram showing the structure of an RF transmitter unit according to a third embodiment of this invention.
Figure 7:
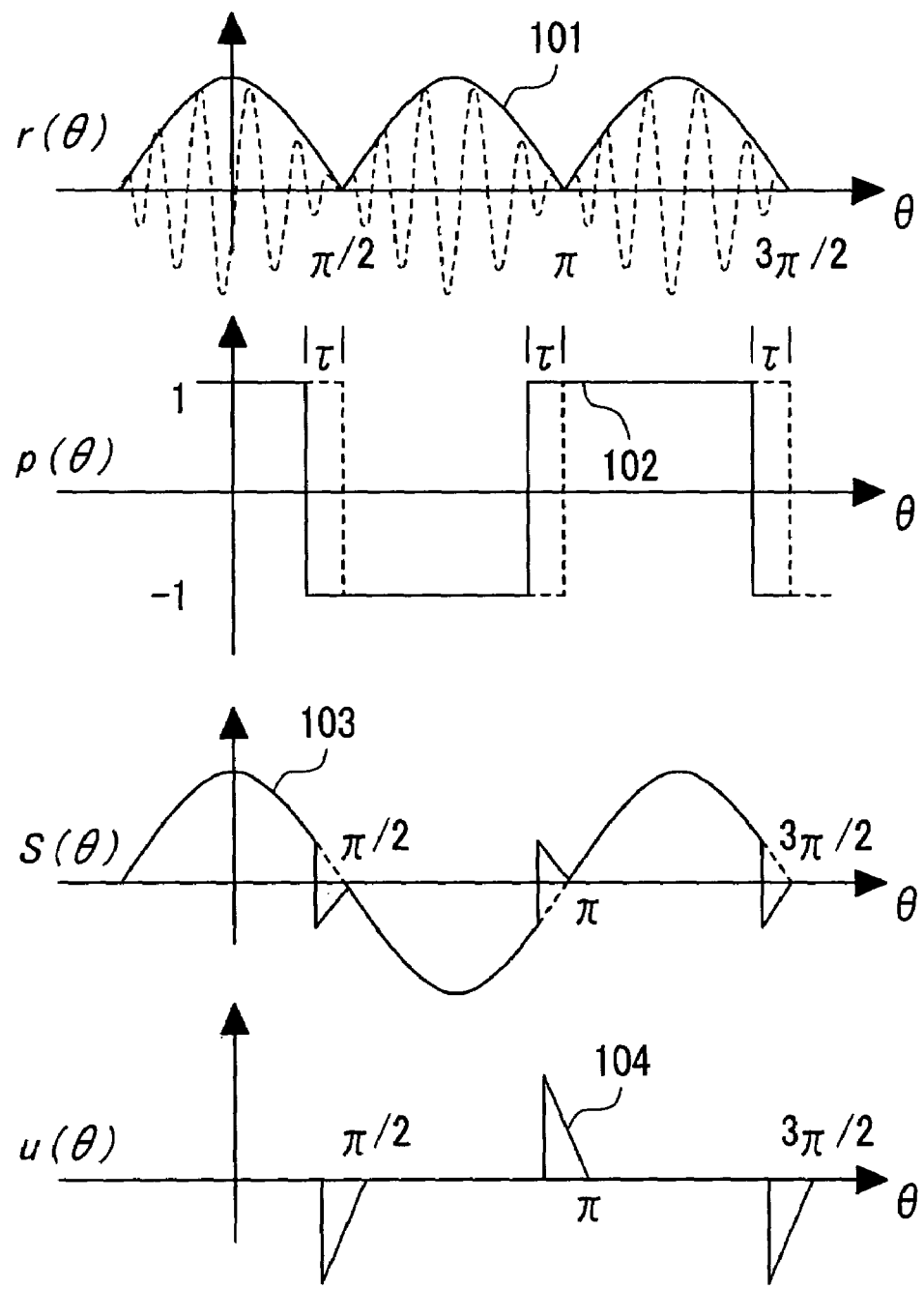
FIG. 7 is a waveform chart showing the principle of degradation in transmission signal quality due to delays of r and θ signals in EER.
Figure 8:
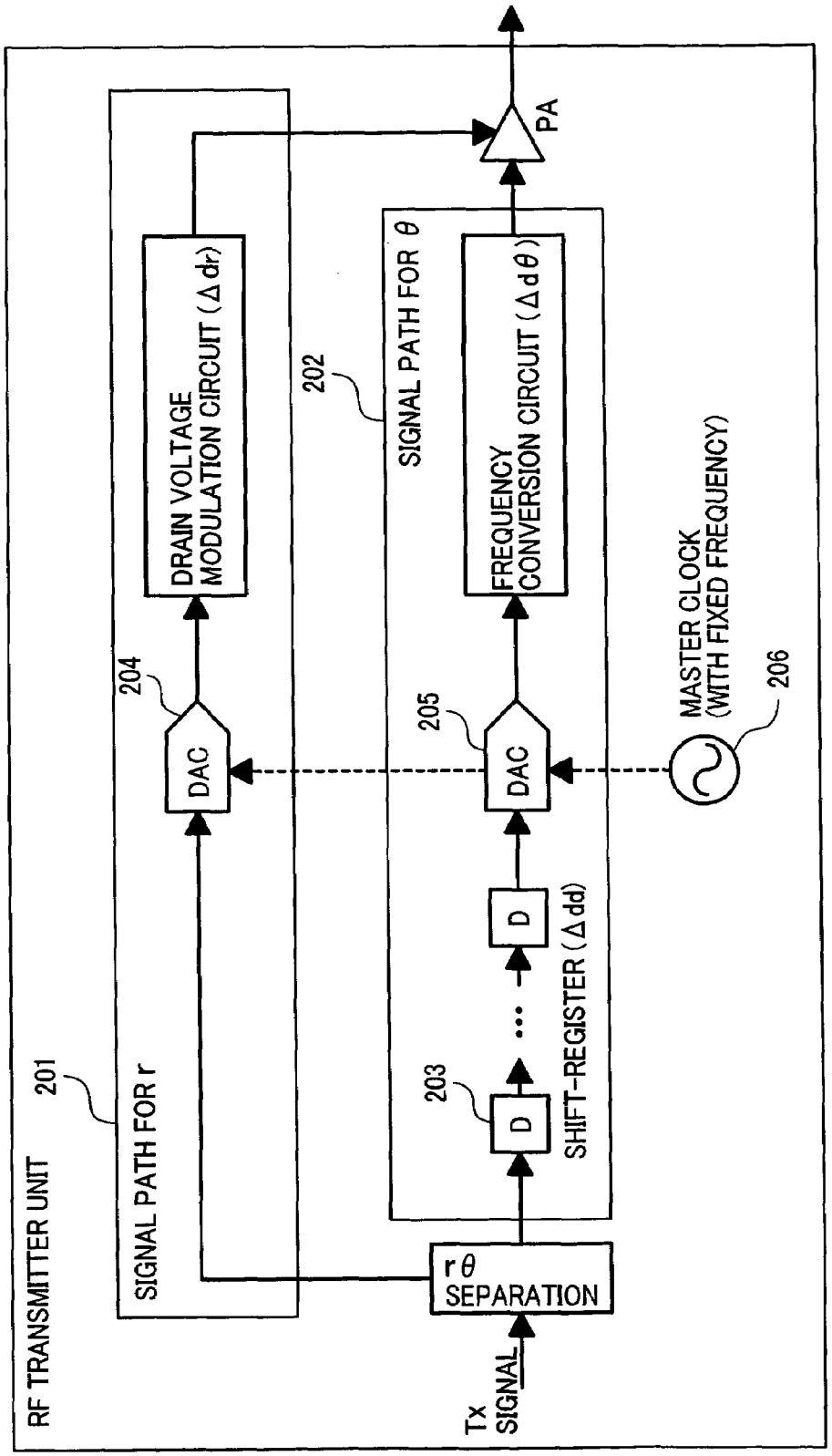
FIG. 8 is a block diagram showing a conventional structure of a transmitter/receiver that employs EER.
Figure 9:
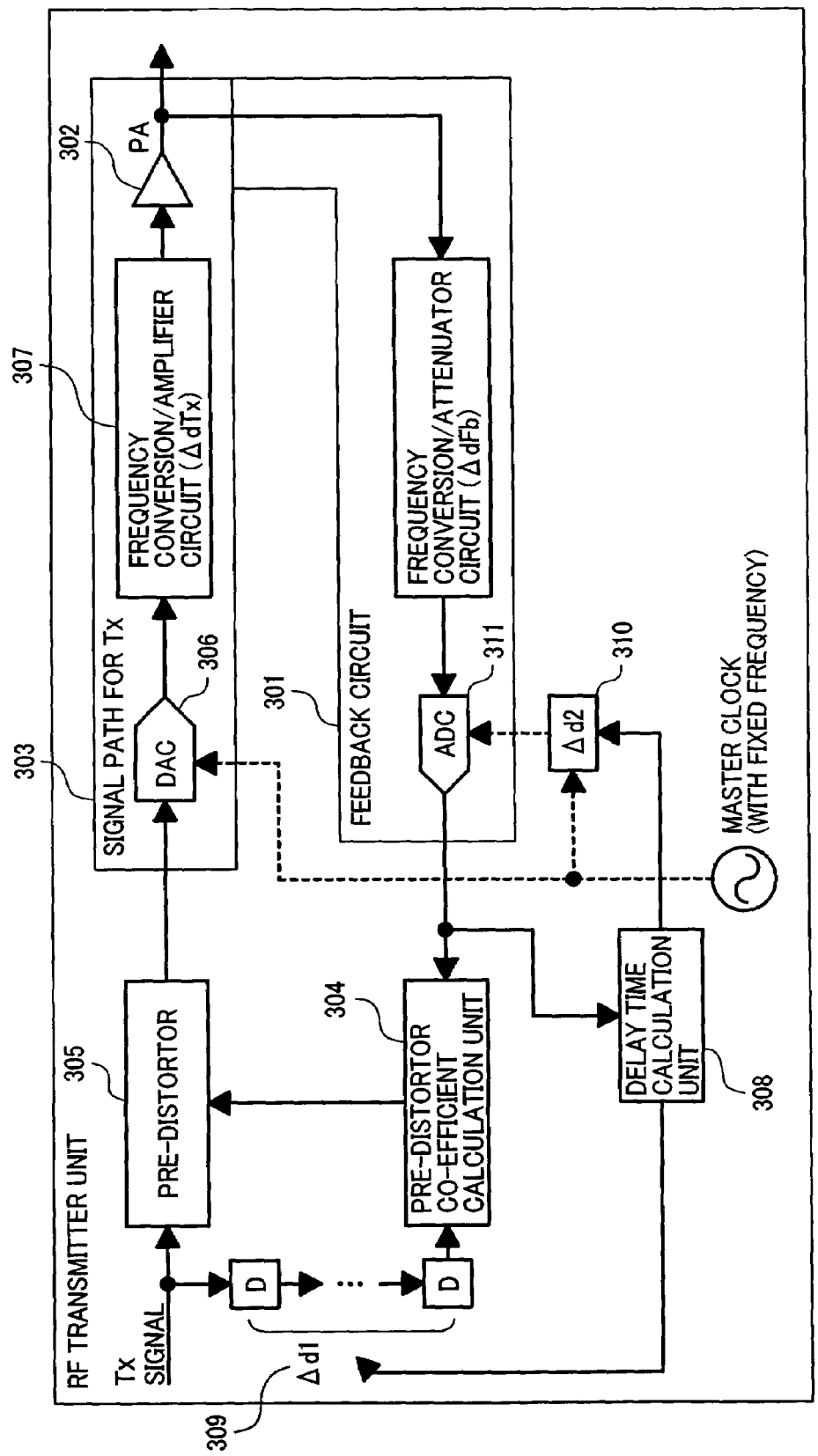
FIG. 9 is a block diagram showing a conventional structure of a predistortion transmitter.

FIG. 6 is a block diagram showing the structure of an RF transmitter unit 403 according to a third embodiment of this invention.

This embodiment deals with one of adjustment methods to adjust, in a transmitter/receiver that employs other systems than EER and that modulates an I signal and a Q signal through paths of different delay amounts, the delay difference between the two signal paths, in order to show that this invention is applicable also when a wireless transmitter employs other systems than EER. This embodiment shares its structure, except the RF transmitter unit 403, with the first embodiment which is shown in FIG. 1. A detailed description on the structure common to this embodiment and the first embodiment will be omitted here.

An I signal and Q signal received from the baseband unit 402 are converted into analog signals by the DACs 901 and 902, respectively. The analog I and Q signals pass the filters 903 and 904, respectively, before combined with each other through modulation by a orthogonal mixer (modulator) 905. The resultant signal receives frequency conversion and then enters a power amplifier 906 from a signal input terminal of the power amplifier 906. A portion of an output of the power amplifier 906 is distributed to a feedback circuit 907 by a distributor (coupler, or the like, omitted from the drawing). In the feedback circuit 907, a frequency-conversion and attenuator unit 908 attenuates the power of the distributed output, which then receives frequency conversion to be converted to the baseband bandwidth (down conversion) and is converted into a digital signal by an ADC 909. Thereafter, the feedback signal is subjected to demodulation by an IQ separation unit 910. The I component of the feedback signal is compared by an I signal DLL 911 against the I component of the transmission signal whereas the Q component of the feedback signal is compared by a Q signal DLL 912 against the Q component of the transmission signal.

With the circuit structure described above, the DLL 911 and 912 judge which one of the transmission signal and the feedback signal is ahead of (or behind) the other. Based on the judgment, the DLL circuits control the output phase-of a voltage controlled oscillator (VCO) 913, which supplies clock signals to the I signal DAC 901, and the output phase of a VCO 914, which supplies clock signals to the Q signal DAC 902, in a manner that makes the difference converges to zero (in a manner that makes the timing of the transmission signal and the timing of the feedback signal synchronize with each other). The feedback signal ADC 909 receives clocks from the oscillator (master clock source) 516 of which output frequency is fixed.

Sample/hold (S/H) circuits to hold signals that are to be inputted to the DACs 901 and 902 are provided on the input side of the DACs 901 and 902.

The structure of the DLL 911 and 912 is the same as that of the DLL circuits in the first embodiment which is shown in FIG. 3. Here, in the DLL 911, an input 1 corresponds to the I component of the transmission signal, an input 2 corresponds to the I component of the feedback signal, and a VCO control signal output is connected to the VCO 913. In the DLL 912, an input 1 corresponds to the Q component of the transmission signal, an input 2 corresponds to the Q component of the feedback signal, and a VCO control signal output is connected to the VCO 914.

Generally speaking, a delay difference between the I component and the Q component is smaller than a delay difference between the r signal and the θ signal in EER, and does not raise a problem in many wireless communication systems. However, considering the fact that the recent advance of broadband has brought about increased use of 64 QAM (Quadrature Amplitude Modulation) and other types of multilevel modulation, an even higher linearity will be demanded from IQ modulation and this embodiment will gain more and more importance from now on.

This invention can be utilized in a transmitter/receiver for a base station or terminal of cellular phone and other wireless communication systems, and improves the waveform quality (linearity) of an output signal of the transmitter/receiver. The improvement of the signal quality allows the device to employ EER of high efficiency or a highly saturated power amplifier. This invention thus contributes to reduction of power consumption of the device.

What is claimed is:

1. A transmitter comprising: two DA converter units which convert two digital signals that are obtained by separating an inputted digital signal or two digital signals that are separately inputted into analog signals; a combiner which combines the analog signals obtained through the conversion by the DA converter units with each other; a distributor which extracts a portion of the combined signal as a feedback signal; an AD Converter which converts the feedback signal into a digital signal; an oscillator unit which supplies clock signals to operate the DA converter units and the AD converter; a first separation unit which separates the feedback signal converted by the AD converter into two signals; and a comparator unit which compares at least one of the two digital signals that are obtained by separating the inputted digital signal or at least one of the two digital signals that are separately inputted with the feedback signal separated by the first separation unit, wherein the oscillator unit controls the clock signals supplied to the DA converter units and the AD converter based on a result of the comparison by the comparator unit.

2. The transmitter according to claim 1, comprising a second separation unit which separates the inputted digital signal into two signals,
   wherein the DA converter units are composed of a first DA converter and a second DA converter,
   wherein the comparator unit compares the input signal separated by the second separation unit against the feedback signal separated by the first separation unit, and judges a timing difference between the two signals,
   wherein the oscillator unit supplies clock signals to the first DA converter, the second DA converter, and the AD converter, and
   wherein the oscillator unit controls the output clock signals to reduces the timing difference while the clock signal that is supplied to one of the converters is used as reference in supplying clock signals to the other two.

3. The transmitter according to claim 2,
   wherein the second separation unit separates the inputted digital signal into an amplitude component and a phase component,
   wherein the first DA converter converts the amplitude component into an analog signal,
   wherein the second DA converter converts the phase component into an analog signal,
   wherein the combiner comprises an amplifier which combines the amplitude component converted into an analog signal and the phase component converted into an analog signal with each other,
   wherein the first separation unit separates the feedback signal into an amplitude component and a phase component,
   wherein the comparator unit comprises:
      a first comparator which compares the amplitude component of the input signal separated by the second separation unit and the amplitude component of the feedback signal separated by the first separation unit to judge a timing difference between the two signals; and
      a second comparator which compares the phase component of the input signal separated by the second separation unit and the phase component of the feedback signal separated by the first separation unit to judge a timing difference between the two signals,
   wherein the oscillator unit comprises:
      a reference oscillator which supplies a clock signal to the AD converter circuit;
      a first variable oscillator which supplies a clock signal to the first DA converter; and
      a second variable oscillator which supplies a clock signal to the second DA converter, and
   wherein the first variable oscillator controls the output clock signal based on a result of the comparison by the first comparator, and the second variable oscillator controls the output clock signal based on a result of the comparison by the second comparator, thereby the variable oscillators the timing of inputting the amplitude component to the amplifier and the timing of inputting the phase component to the amplifier with each other.

4. The transmitter according to claim 2,
   wherein the second separation unit separates the inputted digital signal into an amplitude component and a phase component,
   wherein the first DA converter converts the amplitude component into an analog signal,
   wherein the second DA converter converts the phase component into an analog signal,
   wherein the combiner comprises an amplifier which combines the amplitude component converted into an analog signal and the phase component converted into an analog signal with each other,
   wherein the first separation unit separates the feedback signal into an amplitude component and a phase component,
   wherein the comparator unit comprises:
      a first comparator which compares the amplitude component of the input signal separated by the second separation unit and the amplitude component of the feedback signal separated by the first separation unit, and judges a timing difference between the two signals; and
      a second comparator which compares the phase component of the input signal separated by the second separation unit and the phase component of the feedback signal separated by the first separation unit, and judges a timing difference between the two signals, wherein the oscillator unit comprises:
a second variable oscillator which supplies a clock signal to the AD converters;
a first variable oscillator which supplies a clock signal to the first DA converter; and
a reference oscillator which supplies a clock signal to the second DA converter, and
wherein the first variable oscillator controls the output clock signal based on the result of the comparison by the first comparator, and the second variable oscillator controls the output clock signal based on the result of the comparison by the second comparator, thereby the variable oscillators synchronize the timing of inputting the amplitude component to the amplifier and the timing of inputting the phase component to the amplifier with each other.

5. The transmitter according to claim 1,
wherein the DA converter units comprise:
a first DA converter which converts an I component of the inputted digital signal into an analog signal; and
a second DA converter which converts a Q component of the inputted digital signal into an analog signal,
wherein the combiner comprises a modulator which uses, in modulation, the I component converted into an analog signal and the Q component converted into an analog signal,
wherein the first separation unit separates the feedback signal into an I component and a Q component,
wherein the comparator unit comprises:
a first comparator which compares the I component of the input signal and the I component of the feedback signal converted by the AD converter, and judge a timing difference between the two signals; and
a second comparator which compares the Q component of the input signal and the Q component of the feedback signal converted by the AD converter, and judge a timing difference between the two signals,
wherein the oscillator unit comprises:
a reference oscillator which supplies a clock signal to the AD converters;
a first variable oscillator which supplies a clock signal to the first DA converter; and
a second variable oscillator which supplies a clock signal to the second DA converter, and
wherein the first variable oscillator controls the output clock signal based on a result of the comparison by the first comparator, and the second variable oscillator controls the output clock signal based on a result of the comparison by the second comparator, thereby the variable oscillator synchronize the timing of inputting the I component to the modulator and the timing of inputting the Q component to the modulator with each other.

6. The transmitter circuit according to claim 1, comprising a data holding unit which holds digital signals inputted to at least one of the DA converters and outputted from the AD converters to which a clock signal is supplied from the oscillator unit.

7. A wireless communication device comprising the transmitter circuit of claim 1.

8. A timing adjustment method for a transmitter, comprising: a first step of converting two digital signals that are obtained by separating an inputted digital signal or two digital signals that are separately inputted into analog signals, with clock signals; a second step of combining the analog signals obtained through the conversion in the first step, with each other; a third step of extracting a portion of the signal combined in the second step, as a feedback signal; a fourth step of converting the feedback signal into a digital signal; a fifth step of separating the feedback signal converted into the digital signal in the fourth step, into two signals; and a sixth step of comparing at least one of the two digital signals that are obtained by separating the inputted digital signal or at least one of the two digital signals that are separately inputted against the feedback signal separated in the fifth step, a seventh step of controlling the clock signals supplied to the digital-to-analog conversion in the first step based on a result of the comparing in the sixth step.

9. The timing adjustment method for a transmitter according to claim 8, comprising an eighth step of separating the inputted digital signal into two signals,
wherein the sixth step includes comparing the input signal separated in the eight step and the feedback signal separated in the fifth step, and judging a timing difference between the two signals, and
wherein the seventh step includes controlling clock signals for at least one of the digital-to-analog conversion in the first step and the analog-to-digital conversion in the fourth step to reduces the timing difference, based on a result of the comparing in the sixth step.

10. The timing adjustment method for a transmitter circuit according to claim 9,
wherein the eighth step includes separating the inputted digital signal into an amplitude component and a phase component,
wherein the first step includes converting the amplitude component into an analog signal and converting the phase component into an analog signal,
wherein the second step includes using an amplifier to combine the amplitude component converted into an analog signal and the phase component converted into an analog signal with each other,
wherein the fifth step includes separating the feedback signal into an amplitude component and a phase component,
wherein the sixth step includes:
comparing the amplitude component of the input signal separated in the eighth step and the amplitude component of the feedback signal separated in the fifth step, and judging a timing difference between the two signals; and
comparing the phase component of the input signal separated in the eighth step and the phase component of the feedback signal separated in the fifth step, and judging a timing difference between the two signals, and
wherein the seventh step includes making the timing of inputting the amplitude component to the amplifier circuit and the timing of inputting the phase component to the amplifier circuit synchronize with each other by:
controlling a clock signal for use to convert the amplitude component into an analog signal in the second step based on a result of the comparing of the amplitude component in the sixth step; and
controlling a clock signal for use to convert the phase component into an analog signal in the second step based on a result of the comparing of the phase component in the sixth step.

11. The timing adjustment method for a transmitter according to claim 9,
wherein the eighth step includes separating the inputted digital signal into an amplitude component and a phase component, wherein the first step includes converting the amplitude component into an analog signal and converting the phase component into an analog signal, wherein the second step includes using an amplifier to combine the amplitude component converted into an analog signal and the phase component converted into an analog signal with each other, wherein the fifth step includes separating the feedback signal into an amplitude component and a phase component, wherein the sixth step includes:
  comparing the amplitude component of the input signal separated in the eighth step and the amplitude component of the feedback signal separated in the fifth step, and judging a timing difference between the two signals; and
  comparing the phase component of the input signal separated in the eighth step and the phase component of the feedback signal separated in the fifth step, and judging a timing difference between the two signals, and wherein the seventh step includes making the timing of inputting the amplitude component to the amplifier circuit and the timing of inputting the phase component to the amplifier circuit synchronize with each other by:
  controlling a clock signal for use to convert the amplitude component into an analog signal in the second step based on a result of the comparing of the amplitude component in the sixth step; and
  controlling a clock signal for use to convert the feedback signal into a digital signal in the fourth step based on a result of the comparing of the phase component in the sixth step.

12. The timing adjustment method for a transmitter according to claim 8, wherein the first step includes converting an I component of the inputted digital signal into an analog signal and converting a Q component of the inputted digital signal into an analog signal, wherein the second step includes using a modulator to combine the I component converted into an analog signal and the Q component converted into an analog signal with each other, wherein the fifth step includes separating the feedback signal into an I component and a Q component, wherein the sixth step includes:
  comparing the I component of the input signal and the I component of the feedback signal converted in the fourth step, and judging a timing difference between the two signals; and
  comparing the Q component of the input signal and the Q component of the feedback signal converted in the fourth step, and judging a timing difference between the two signals, and wherein the seventh step includes making the timing of inputting the I component to the modulator and the timing of inputting the Q component to the modulator synchronize with each other by:
  controlling a clock signal for use to convert the I component into an analog signal in the second step based on a result of the comparing of the I component in the sixth step; and
  controlling a clock signal for use to convert the Q component into an analog signal in the second step based on a result of the comparing of the Q component in the sixth step.

* * * * *